(12) United States Patent
Lin

(10) Patent No.: US 8,243,401 B2
(45) Date of Patent: Aug. 14, 2012

(54) TUNNELING MAGNETORESISTANCE READ SENSOR WITH DUAL SENSE LAYERS

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 467 days.

(21) Appl. No.: 12/587,155

(22) Filed: Oct. 2, 2009

(65) Prior Publication Data

US 2011/0081558 A1    Apr. 7, 2011

(51) Int. Cl.
*G11B 5/33* (2006.01)
(52) U.S. Cl. .................................................. 360/324.2
(58) Field of Classification Search ............ 360/324.12, 360/324.2, 324.11; 29/603.03, 603.04, 603.12, 29/603.16
See application file for complete search history.

(56) References Cited

U.S. PATENT DOCUMENTS

| | | | |
|---|---|---|---|
| 5,896,252 A | 4/1999 | Kanai | |
| 6,452,386 B1 | 9/2002 | Hayashi | |
| 6,552,882 B1 | 4/2003 | Hayashi | |
| 6,724,585 B2 | 4/2004 | Hayashi | |
| 6,815,082 B2 | 11/2004 | Girt | |
| 6,831,312 B2 | 12/2004 | Slaughter et al. | |
| 7,064,936 B2 | 6/2006 | Hayashi | |
| 7,298,596 B2 | 11/2007 | Hayashi et al. | |
| 7,333,306 B2 | 2/2008 | Zhao et al. | |
| 7,663,131 B2* | 2/2010 | Horng et al. | 257/2 |
| 7,898,846 B2* | 3/2011 | Nagamine et al. | 365/158 |
| 7,978,439 B2* | 7/2011 | Zhang et al. | 360/324.11 |
| 2006/0180839 A1 | 8/2006 | Fukumoto et al. | |
| 2007/0014149 A1* | 1/2007 | Nagamine et al. | 365/158 |
| 2007/0217082 A1 | 9/2007 | Lin | |
| 2008/0217710 A1* | 9/2008 | Horng et al. | 257/421 |
| 2008/0316657 A1* | 12/2008 | Zhang et al. | 360/324.11 |
| 2009/0225587 A1* | 9/2009 | Nagamine et al. | 365/158 |
| 2009/0251829 A1* | 10/2009 | Zhang et al. | 360/319 |
| 2011/0116305 A1* | 5/2011 | Nagamine et al. | 365/158 |
| 2011/0236723 A1* | 9/2011 | Lin | 428/811.2 |
| 2011/0268992 A1* | 11/2011 | Zhang et al. | 428/811.1 |

OTHER PUBLICATIONS

Dave et al., MgO Based Tunnel Junction Material for High Speed Toggle Random Access Memory, Aug. 2006, IEEE Trans on Magn, vol. 42, No. 8, pp. 1935-1939.
Hayakawa et al., Current Drive Magnetization Switching in CoFeB/MgO/CoFeB Magnetic Tunnel Junctions, Intermag, 2006, p. 6.

* cited by examiner

*Primary Examiner* — Allen Cao
(74) *Attorney, Agent, or Firm* — D'Arcy H. Lorimer; Lorimer Labs

(57) ABSTRACT

A tunneling magnetoresistance (TMR) read sensor with a Co—Fe—B lower sense layer and a Co—Hf upper sense layer is disclosed. In order for the dual sense layers to exhibit a negative saturation magnetostriction ($\lambda_S$), their Fe contents are either substantially reduced or even eliminated, instead of adding a conventional Ni—Fe film as an additional sense layer. By optimizing compositions and thicknesses of the dual sense layers, the dual sense layers indeed exhibit a negative $\lambda_S$, while the TMR sensor exhibits a TMR coefficient ($\Delta R_T/R_J$) of greater than 80% at a junction resistance-area product ($R_J A_J$) of less than 2 $\Omega$-$\mu m^2$.

21 Claims, 8 Drawing Sheets

TUNNELING MAGNETORESISTANCE READ SENSOR WITH DUAL SENSE LAYERS

BACKGROUND OF THE INVENTION

1. Field of the Invention

The invention relates to the structure of a read sensor used in a hard disk drive for magnetic recording. Specifically, the invention relates to a current-perpendicular-to-plane (CPP) tunneling magnetoresistance (TMR) read sensor with dual sense layers that exhibit a negative saturation magnetostriction.

2. Description of the Related Art

In the data reading process of a hard disk drive, a read head passes over magnetic transitions of a data track on a rotating hard disk, and magnetic fields emitting from the magnetic transitions modulate the resistance of a read sensor in the read head. Changes in the resistance of the read sensor are detected by a sense current passing through the read sensor. The resistance changes can be read directly and converted into voltage signals from which read data encoded in the magnetic transitions of the data track are generated. Two of the most common read sensors used in modern hard disk drives are a current-perpendicular-to-plane (CPP) tunneling magnetoresistance (TMR) read sensor, and a CPP giant magnetoresistance (GMR) read sensor. The TMR read sensor consists of an electrically insulating $MgO_x$ barrier layer sandwiched between lower and upper sensor stacks, and relies on an electron tunneling effect across the barrier layer to generate the resistance changes. The GMR read sensor consists of an electrically conducting copper (Cu) or copper oxide (Cu—O) spacer layer sandwiched between the lower and upper sensor stacks, and relies on an electron scattering effect at the spacer layer to generate the resistance changes. The subject of this disclosure is focused on the TMR read sensor.

FIG. 1 (Prior Art) is a partial cross sectional view of an assembly of read and write heads 100. A read head 104 is combined with a write head 102 in a longitudinal type to form the assembly of read and write heads 100. As will be recognized by those skilled in the art, the write head 102 may also be a perpendicular type as well. In the read head 104, a TMR read sensor 106 is sandwiched between a lower shield 108 and an upper shield 110. In the write head 102, a lower pole 112 and an upper pole 116 are separated by a write gap 114, but are connected at a backgap 122. The write head 102 also comprises a yoke 120 and coils 118.

The assembly of read and write heads is supported by a slider that is mounted on a suspension arm. When the hard disk rotates, an actuator swings the suspension arm to place the slider over selected circular data tracks on the hard disk. The suspension arm biases the slider toward the hard disk, and an air flow generated by the rotation of the hard disk causes the slider to fly on a cushion of air at a very low fly height over the hard disk. When the slider rides on the air, the air bearing surface (ABS) of the read and write heads faces the air, and the actuator moves the suspension arm to position the read and write heads over selected data tracks on the hard disk. The read and write heads read data from and write data to, respectively, data tracks on the hard disk.

FIG. 2 (Prior Art) is an ABS view of a read head 200 (equivalent to the read head 104 of FIG. 1). The read head 200 includes the TMR sensor 106, which is sandwiched between the lower shield 108 and the upper shield 110, and is separated by side oxide layers 220 from longitudinal bias layers 222. The TMR read sensor 106 consists of a barrier layer 206, which is sandwiched between a lower sensor stack and an upper sensor stack. The barrier layer 206 typically comprises an electrically insulating $MgO_x$ film.

A typical lower sensor stack consists of a buffer layer 218 comprising a nonmagnetic Ta film, a seed layer 216 comprising a nonmagnetic Ru film, a pinning layer 214 comprising an antiferromagnetic Ir—Mn film, a keeper layer 212 comprising a ferromagnetic Co—Fe film, an antiparallel coupling layer 210 comprising a nonmagnetic Ru film, and a reference layer 208 comprising a ferromagnetic Co—Fe—B film. The keeper, antiparallel-coupling and reference layers form a flux-closure structure where four fields are induced. First, a unidirectional anisotropy field ($H_{UA}$) is induced by exchange coupling between the pinning layer and the keeper layer. Second, a bidirectional anisotropy field ($H_{BA}$) is induced by antiparallel coupling between the keeper and reference layers and across the antiparallel-coupling layer. Third, a demagnetizing field ($H_D$) is induced by the net magnetization of the keeper and reference layers. Fourth, a ferromagnetic-coupling field ($H_F$) is induced by ferromagnetic coupling between the reference and sense layers and across the barrier layer. To ensure proper sensor operation, $H_{UA}$ and $H_{BA}$ should be high enough to rigidly pin magnetizations of the keeper and reference layers in opposite transverse directions perpendicular to the ABS, while $H_D$ and $H_F$ should be small and balance with each other to orient the magnetization of the sense layer in a longitudinal direction parallel to the ABS.

A typical upper sensor stack consists of a sense layer 204 comprising a ferromagnetic Co—Fe—B film and a cap layer 202 comprising a nonmagnetic Ru film. Both the Co—Fe—B reference and sense layers exhibit a "soft" amorphous phase after depositions, which will be transformed into a polycrystalline phase after annealing. With this crystallization, a Co—Fe—B(001)[110]//$MgO_x$(001)[100]//Co—Fe—B (001)[110] epitaxial relationship is developed, and thus coherent spin polarization through the $MgO_x$ barrier layer is induced, thereby enhancing a TMR effect.

To ensure stable sensor operation, it is desirable that the sense layer exhibits a negative, or at least zero, saturation magnetostriction ($\lambda_S$). After receiving compressive stresses induced by mechanical lapping in the fabrication process of the read and write heads, a sense layer with a negative $\lambda_S$ will longitudinally bias its own magnetization in a longitudinal direction parallel to the ABS in the absence of an external magnetic field. Such a sense layer only requires low longitudinal bias fields provided by neighboring longitudinal bias layers for the stable read performance. In contrast, a sense layer with a positive $\lambda_S$ may bias its own magnetization in a transverse direction perpendicular to the ABS in the absence of an external magnetic field. This sense layer thus requires high longitudinal bias fields for the stable read performance. The increase in the longitudinal bias fields will lead to a decrease in read sensitivity. In addition to attaining a desirable negative $\lambda_S$ for the sense layer, it is crucial for the TMR sensor to maintain a high TMR coefficient ($\Delta R_J/R_J$) at a low junction resistance-area product ($R_J A_J$), where $R_J$ is a minimum junction resistance measured when the magnetizations of the reference and sense layers are parallel to each other, and $R_J + \Delta R_J$ is a maximum junction resistance measured when the magnetizations of the reference and sense layers are antiparallel to each other, and $A_J$ is a junction area.

In the prior art, the most extensively explored TMR read sensor with reference and sense layers comprising 60Co-20Fe-20B (in atomic percent) films exhibits $\Delta R_J/R_J$ of as high as 138% at $R_J A_J$ of as low as 2.4 $\Omega$-$\mu m^2$, after annealing for 2 hours at 360° C. in 8,000 Oe in a high vacuum oven. However, its sense layer exhibits $\lambda_S$ of as high as $+6 \times 10^{-6}$. This high $\lambda_S$ originates from the high Fe content and the high-temperature annealing. A conventional approach of adding a second sense layer comprising a Ni—Fe film does produce a negative $\lambda_S$, but at the expense of decreasing $\Delta R_T/R_J$ to an unacceptably low value of 40% and increasing $RA_J$ to an unacceptably high value of 4 $\Omega$-$\mu m^2$. Such deteriorated TMR properties originates from unwanted Ni diffusion from the Ni—Fe to Co—Fe—B sense layers. Preferably, it is desirable to have a TMR read sensor with a negative $\lambda_S$, combined with $\Delta R_T/R_J$ of greater than 80% at $R_JA_J$ of less than 2 $\Omega$-$\mu m^2$.

What is needed is attaining a negative $\lambda_S$ for the sense layer while maintaining high $\Delta R_T/R_J$ at low $RA_J$ for the TMR read sensor.

SUMMARY OF THE INVENTION

It is an object of the invention to provide a TMR read sensor which includes of a $MgO_x$ barrier layer, a lower sense layer comprising a Co—Fe—B film deposited on the $MgO_x$ barrier layer, an upper sense layer comprising a Co—Hf film deposited on the lower sense layer, and a cap layer comprising a Ru film deposited on the upper sense layer. The dual sense layers exhibit a saturation magnetostiction ($\lambda_S$) of less than zero, while the TMR read sensor exhibits a TMR coefficient ($\Delta R_T/R_J$) of greater than 80% at a junction resistance-area product ($R_JA_J$) of less than 2 $\Omega$-$\mu m^2$.

It is another object of the present invention to provide a thin film magnetic head having a TMR read sensor which includes a MgOx barrier layer; a lower sense layer, containing a Co—Fe—B alloy, deposited on the MgOx barrier layer, the Co—Fe—B alloy having a Co composition between 71 and 86 atomic %, an Fe composition between 8 and 3 atomic %, and a B composition between 11 and 22 atomic %; an upper sense layer, containing a Co—Hf alloy, deposited on the lower sense layer, the Co—Hf alloy having a Co composition between 84 and 85 atomic %; and a cap layer deposited on the upper sense layer, wherein the TMR read sensor has a saturation magnetostiction value less than zero, a resistance-area product less than 2 W-µm2, and a TMR coefficient greater than 80%.

It is yet another object of the present invention to provide a thin film magnetic head having a TMR read sensor which includes a MgOx barrier layer; a lower sense layer, containing a Co—Fe—B alloy, deposited on the MgOx barrier layer, the Co—Fe—B alloy having a Co composition between 79 and 86 atomic %, an Fe composition between 5 and 3 atomic %, and a B composition between 11 and 15 atomic %; an upper sense layer, containing a Co—Hf alloy, deposited on the lower sense layer, the Co—Hf alloy having a Co composition between 84 and 85 atomic %; and a cap layer deposited on the upper sense layer, wherein the TMR read sensor has a saturation magnetostiction value less than zero, a resistance-area product less than 2 W-µm2, and a TMR coefficient greater than 80%.

BRIEF DESCRIPTION OF THE DRAWINGS

The invention will be better understood when consideration is given to the following detailed description thereof. Such description makes reference to the annexed drawings, wherein.

DETAILED DESCRIPTION OF THE PREFERRED EMBODIMENTS

Figure 1:
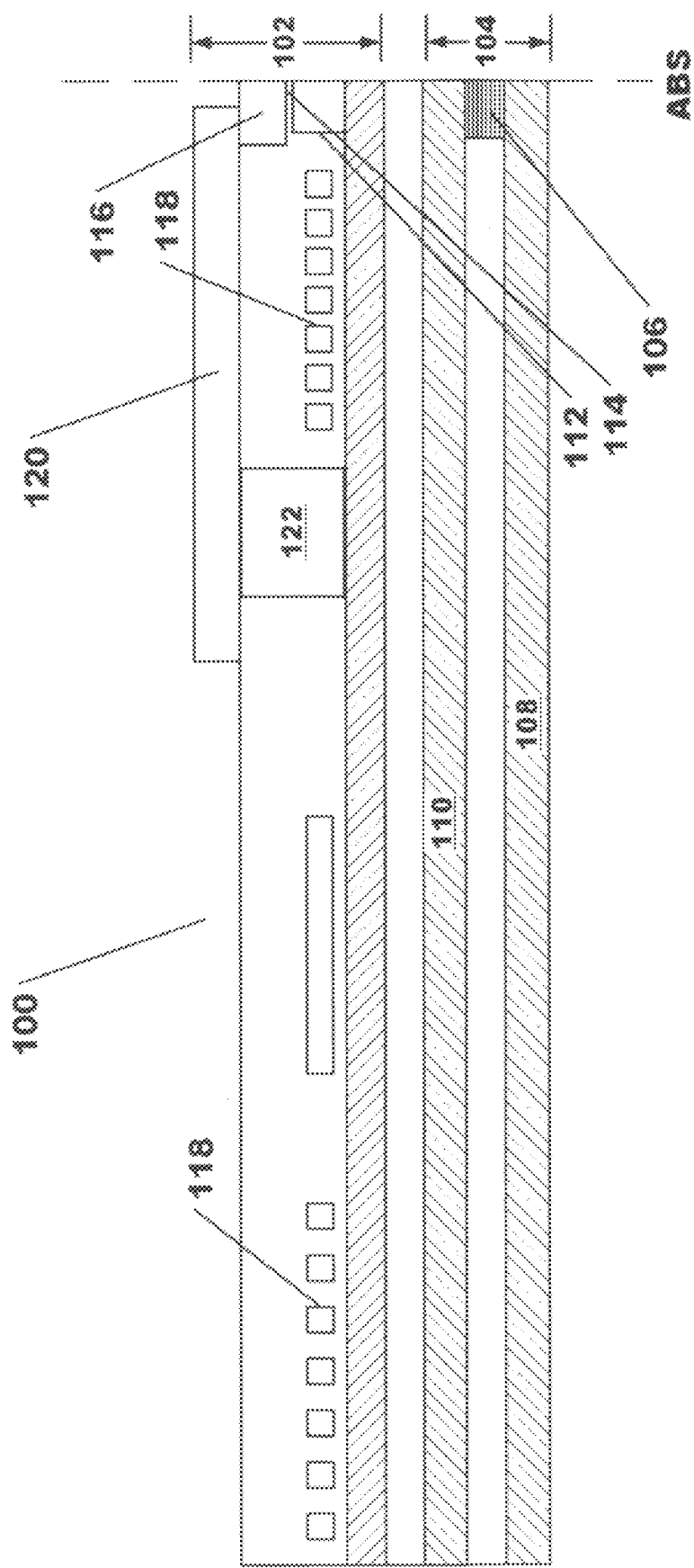
FIG. 1 (Prior Art) is a partial cross section view of an assembly of read and write heads.
Figure 2:
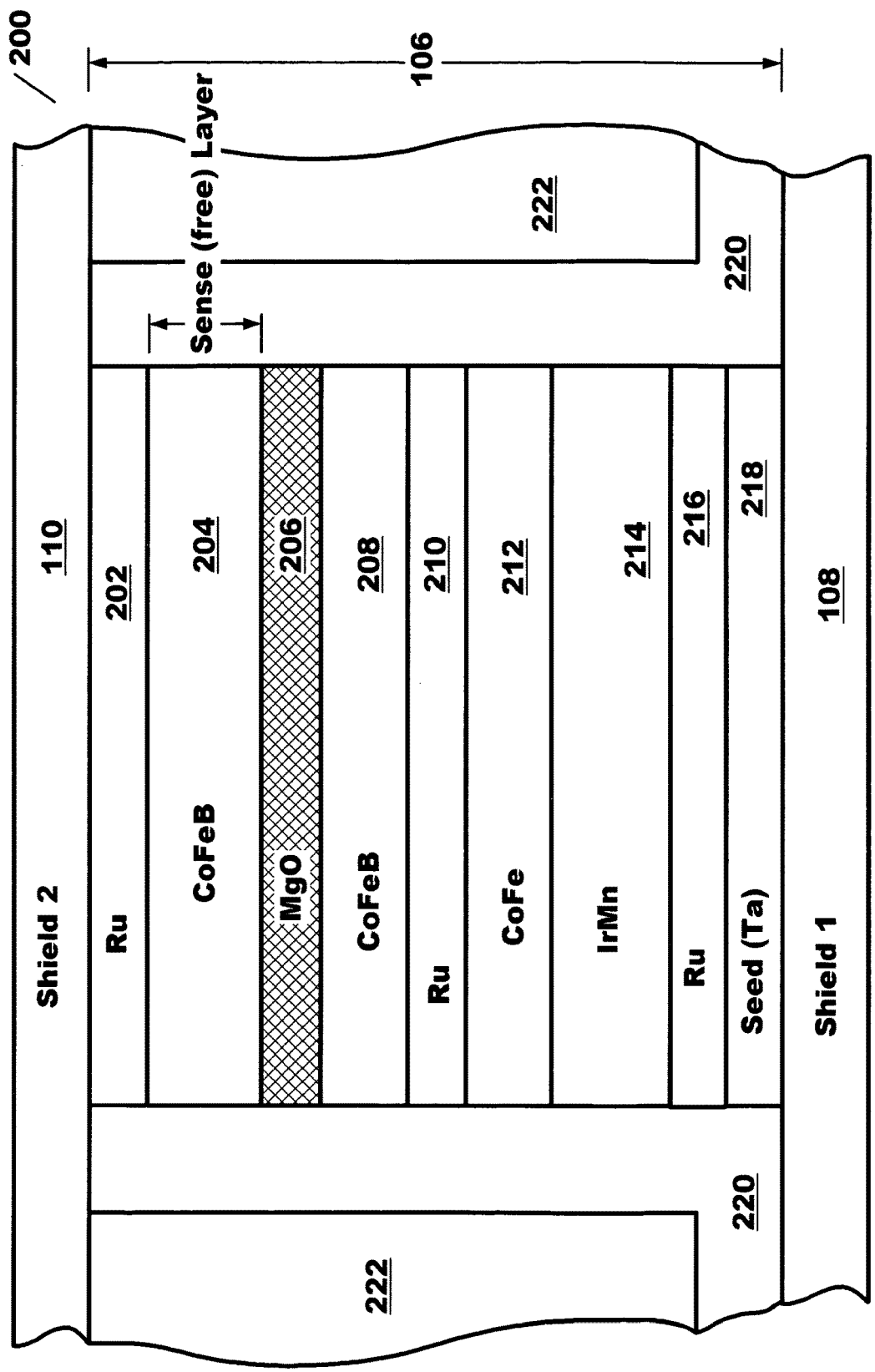
FIG. 2 (Prior Art) is an ABS view of a read head.

FIGS. 1 and 2 (Prior Art) have been discussed above.

Figure 3:
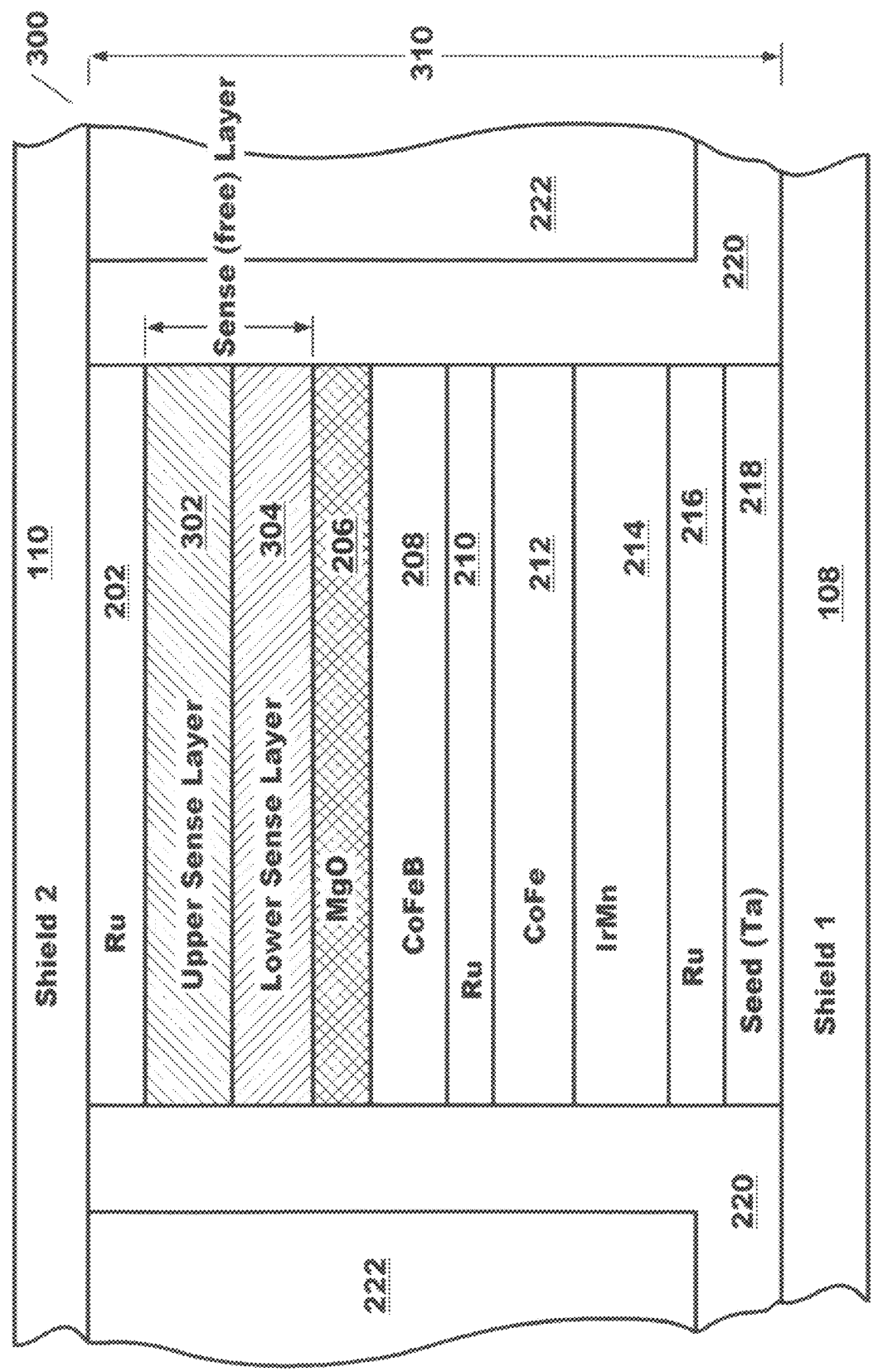
FIG. 3 is an ABS view of a TMR read head in accordance with an embodiment of the invention.

FIG. 3 is an ABS view of a TMR read head 300 including a TMR read sensor 310 in accordance with an embodiment of the invention. The invention is distinguished from the prior art disclosed in FIG. 2 by the replacement of the sense layer 204 with dual sense layers comprising a lower sense layer 304 and an upper sense layer 302. The lower sense layer 304 comprises a ferromagnetic "soft" amorphous Co—Fe—B film, and the upper sense layer 302 comprises a ferromagnetic "hard" amorphous Co—Hf film.

The ferromagnetic "soft" amorphous Co—Fe—B film contains B atoms with a content that is high enough in order for the B atoms smaller than Co and Fe atoms to occupy interstitial sites of a Co—Fe crystalline structure, thus interfering with the ability of the Co and Fe atoms to crystallize and forming an amorphous phase after the deposition. This amorphous phase is "soft" since it will transform into a polycrystalline phase after annealing at 240° C. and beyond, and plays an important role in ensuring the epitaxial relationship needed for enhancing the TMR effects as previously described.

The ferromagnetic "hard" amorphous Co—Hf film contains Hf atoms with a content that is high enough in order for the Hf atoms larger than Co atoms to occupy substitute sites of the Co crystalline structure, thus interfering with the ability of the Co atoms to crystallize and forming another amorphous phase after the deposition. This amorphous phase is "hard" since it will remain intact after annealing at as high as 360° C., and acts as if an amorphous cap layer that induces scattering of conduction electrons, thus further enhancing the TMR effect. Zr and Y atoms, which are also much larger than the Co atoms, can also be added into the Co film for the formation of the ferromagnetic "hard" amorphous phase.

In addition to ensuring the formation of the ferromagnetic "soft" and "hard" amorphous phases in the lower sense layer 304 and the upper sense layer 302, respectively, their specific compositions and thicknesses are optimized in order for the dual sense layers to exhibit good ferromagnetic properties including a negative saturation magnetostriction ($\lambda_S$), a low easy-axis coercivity ($H_C$) and a low $H_F$, and for the TMR sensor to exhibit good TMR properties including a low junction resistance-area product ($R_JA_J$) and a high TMR coefficient ($\Delta R_T/R_J$).

To attain optimal compositions and thicknesses, TMR read sensors with various single and dual sense layers are fabricated in accordance with following procedures.

The TMR read sensors are deposited on Si wafers coated with 100 nm thick nonmagnetic $SiO_2$ films, bare glass substrates, and Al—Ti—C wafers coated with 1 μm thick ferromagnetic Ni—Fe films in a sputtering system, and are annealed in a magnetic field of 50,000 Oe for 5 hours at 240° C. in a high-vacuum oven. The TMR read sensors deposited on the Si/SiO$_2$ wafers are measured with a bending tool to determine $\lambda_S$. The TMR read sensors deposited on the bare glass substrates are measured with a vibrating sample magnetometer to determine $H_C$ and $H_F$. The TMR read sensors deposited on the Al—Ti—C/Ni—Fe wafers are coated with Cu(75)/Ru(12) top conducting leads, and are probed with a 12-point microprobe in a magnetic field of about 160 Oe. Measured data from any four of the microprobe are analyzed with a current-in-plane tunneling model to determine $R_J A_J$ and $\Delta R_T / R_J$.

The MgOx barrier layer 206 comprises a nonmagnetic magnesium oxide (MgO) film sandwiched between two nonmagnetic oxygen-doped Mg (Mg—O) films as described below. A 0.2 nm thick Mg film is DC sputtered in an argon gas of $3\times10^{-4}$ ton from a Mg target with a power of 40 W. A first oxygen treatment in an oxygen gas of $5\times10^{-7}$ torr is then applied to the Mg film for oxygen doping into the Mg film. A 0.4 nm thick MgO film is then RF sputtered in an argon gas of $4.5\times10^{-4}$ ton from a MgO target with a power of 200 W. Another 0.2 nm thick Mg film is then DC sputtered in an argon gas of $3\times10^{-4}$ ton from the Mg target with the power of 40 W. A second oxygen treatment in an oxygen gas of $5\times10^{-5}$ ton is then applied to the Mg film for oxygen doping into the entire $MgO_x$ barrier layer 206.

The lower sensor stack consists of a buffer layer 218 comprising a 2 nm thick nonmagnetic Ta film, a seed layer 216 comprising a 2 nm thick nonmagnetic Ru film, a pinning layer 214 comprising a 6 nm thick antiferromagnetic 21.7Ir-78.3Mn film, a keeper layer 212 comprising a 2.2 nm thick ferromagnetic 77.5Co-22.5 Fe film, an antiparallel coupling layer 210 comprising a 0.8 nm thick nonmagnetic Ru film, and a reference layer 208 comprising a 2.2 nm thick ferromagnetic "soft" amorphous 51.9Co-34.6Fe-13.5B film. Thicknesses of the Co—Fe keeper layer 212 and the Co—Fe—B reference layer 208 are fixed in order to attain designed magnetic moments of 0.28 and 0.30 memu/cm$^2$ (equivalent to those of 4 and 4.3 nm thick 80Ni-20Fe sense layers with saturation magnetizations $M_S$ of 700 memu/cm$^3$ sandwiched between two Cu films, respectively), respectively, for ensuring proper sensor operation.

The upper sensor stack consists of a lower sense layer 304 comprising the ferromagnetic "soft" amorphous Co—Fe—B film, the upper sense layer 302 comprising the ferromagnetic "hard" amorphous Co—Hf film, and a cap layer 202 comprising a 6 nm thick nonmagnetic Ru film. Thicknesses of the dual sense layers are adjusted in order to attain a designed magnetic moment of 0.32 memu/cm$^2$ (equivalent to that of a 4.5 nm thick 80Ni-20Fe sense layer sandwiched between two Cu films), as described below, for achieving high read sensitivity.

Figure 4:
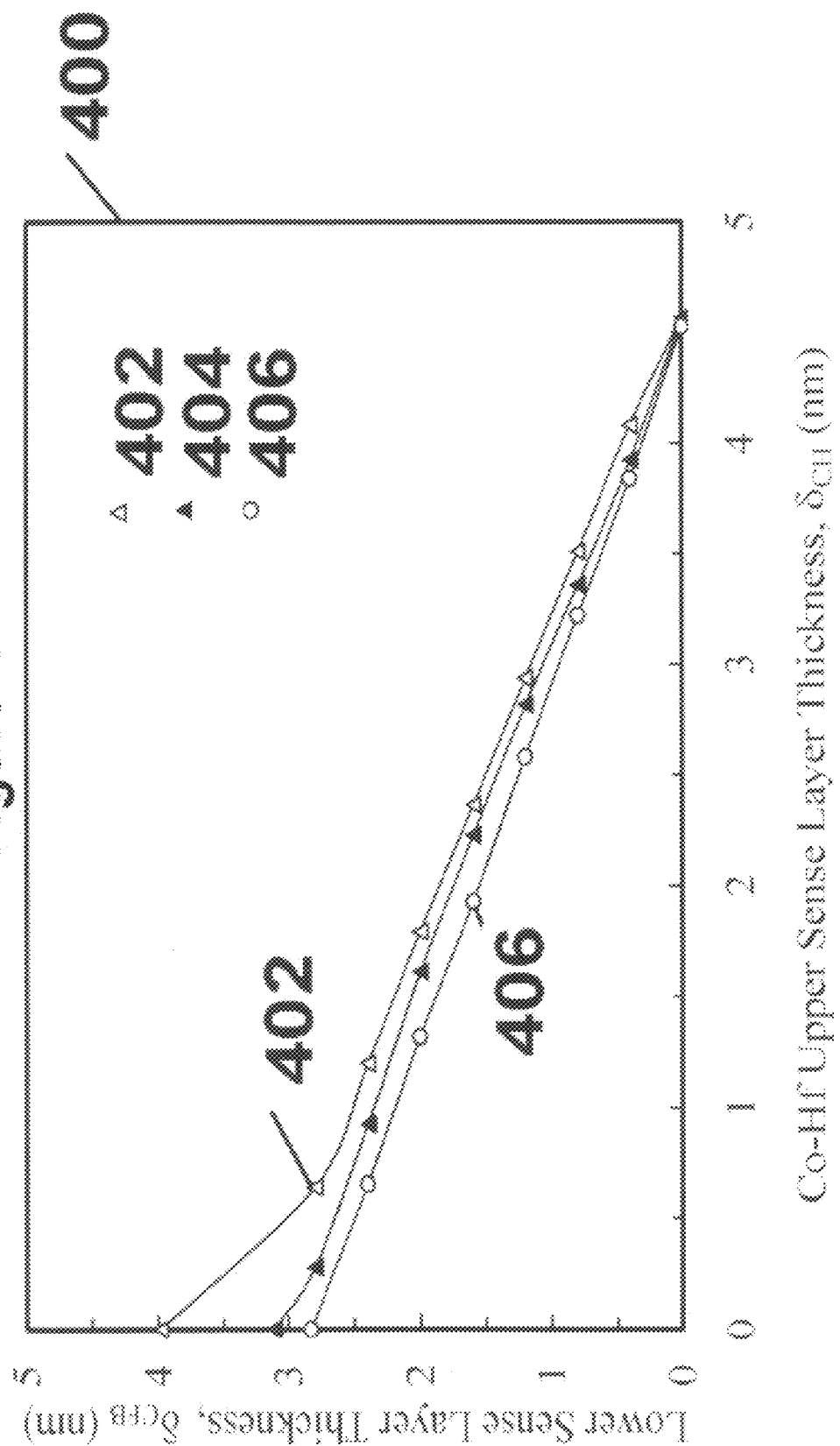
FIG. 4 is a graph of the thickness of the lower sense layer versus the thickness of the upper sense layer in accordance with an embodiment of the invention.

FIG. 4 is a graph 400 of the thickness of the lower sense layer versus the thickness of the upper sense layer in accordance with an embodiment of the invention. The lower sense layers comprise 71.4Co-7.3Fe-21.3B, 79.1Co-5.5Fe-15.4B and 85.2Co-3.8Fe-11B films with Ms of 865.9, 1036.2 and 1173.7 memu/cm$^3$, respectively, while the upper sense layer comprises a 84.7Co-15.3Hf film with $M_S$ of 744.6 memu/cm$^3$. Plots 402, 404 and 406 show that as the thickness of the upper sense layer comprising the 84.7Co-15.3Hf film increases from 0 to 4.53 nm, thicknesses of the lower sense layer comprising the 71.4Co-7.3Fe-21.3B, 79.1Co-5.5Fe-15.4B and 85.2Co-3.8Fe-11B films linearly decrease from 3.98, 3.11 and 2.83 nm, respectively, to 0.

Figure 5:
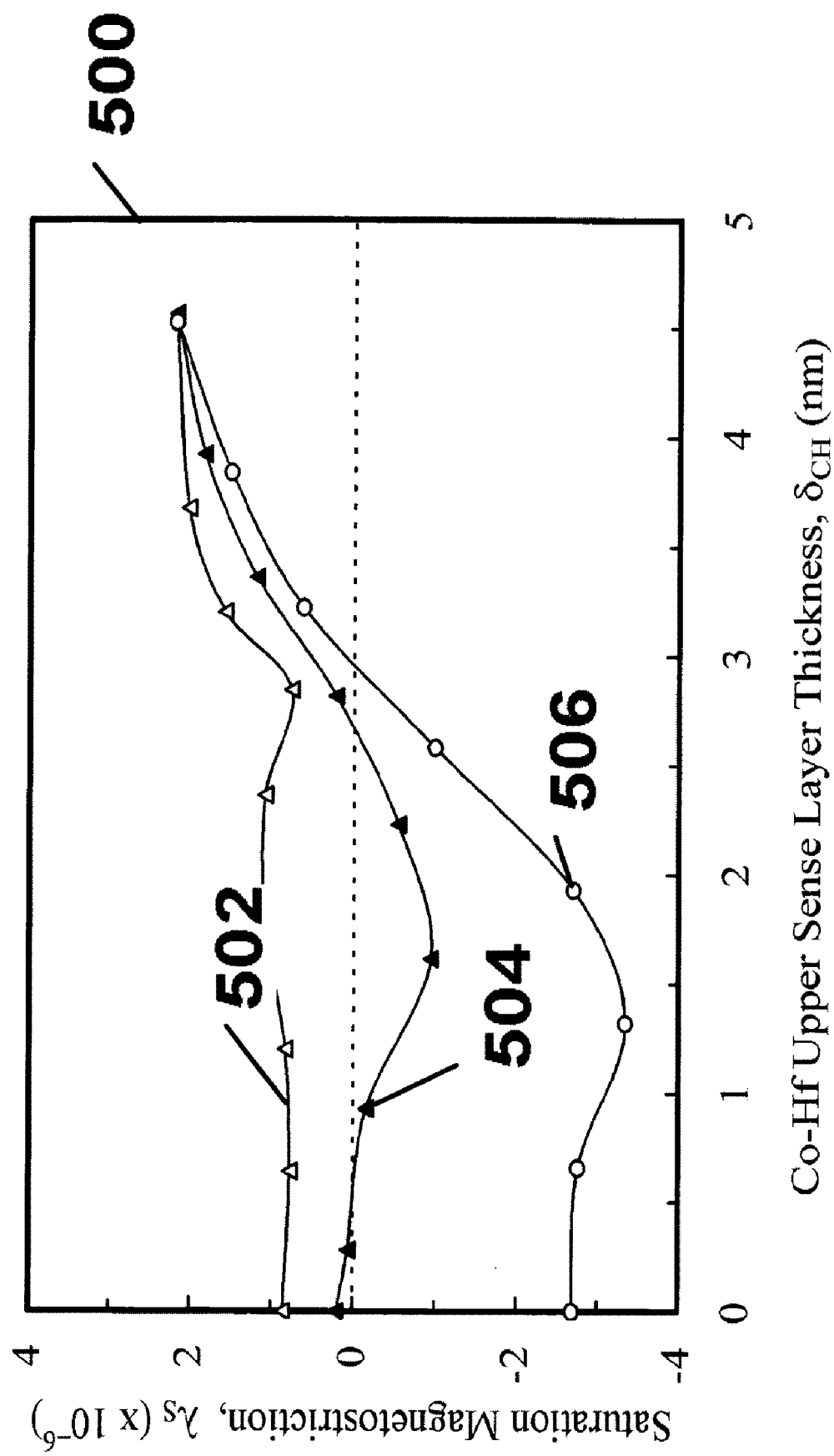
FIG. 5 is a graph of the saturation magnetostriction ($\lambda_S$) versus the thickness of the upper sense layer in accordance with an embodiment of the invention.

FIG. 5 is a graph 500 of the saturation magnetostriction ($\lambda_S$) versus the thickness of the upper sense layer in accordance with an embodiment of the invention. The plot 502 shows that while single sense layers comprising the 71.4Co-7.3Fe-21.3B and 84.7Co-15.3Hf films exhibit $\lambda_S$ of 0.9 and $2.2\times10^{-6}$, respectively, dual sense layers comprising these two films with any varying thicknesses also exhibit non-desirable positive $\lambda_S$. The plot 504 and 506 show that single sense layers comprising the 79.1Co-5.5Fe-15.4B and 85.2Co-3.8Fe-11B films exhibit $\lambda_S$ of 0.2 and $-2.7\times10^{-6}$, respectively, indicating that lower Fe and B contents in the lower sense layer are needed to decrease $\lambda_S$. More interestingly, the plots 504 and 506 also show that by varying the thicknesses of the lower sense layer and the upper sense layer, the dual sense layers exhibit $\lambda_S$ that is much more negative than a value predicted based on a linear relation between the two extreme values. For example, when the lower and upper sense layers comprise 2.0 nm thick 85.2Co-3.8Fe-11B and 1.32 nm thick 84.7Co-15.3Hf films, respectively, $\lambda_S$ reaches as low as $-3.3\times10^{-6}$, instead of $-1.7\times10^{-6}$ as predicted from the linear relationship. To attain a desirable negative $\lambda_S$, the plot 504 indicates that the thickness of the 84.7Co-15.3Hf film preferably ranges from 0.9 to 2.6 nm for the 79.1Co-5.5Fe-15.4B/84.7Co-15.3Hf dual sense layers, while the plot 506 indicates that the thickness of the 84.7Co-15.3Hf film from 0 to 3 nm for the 85.2Co-3.8Fe-11B /84.7Co-15.3Hf dual sense layers.

Figure 6:
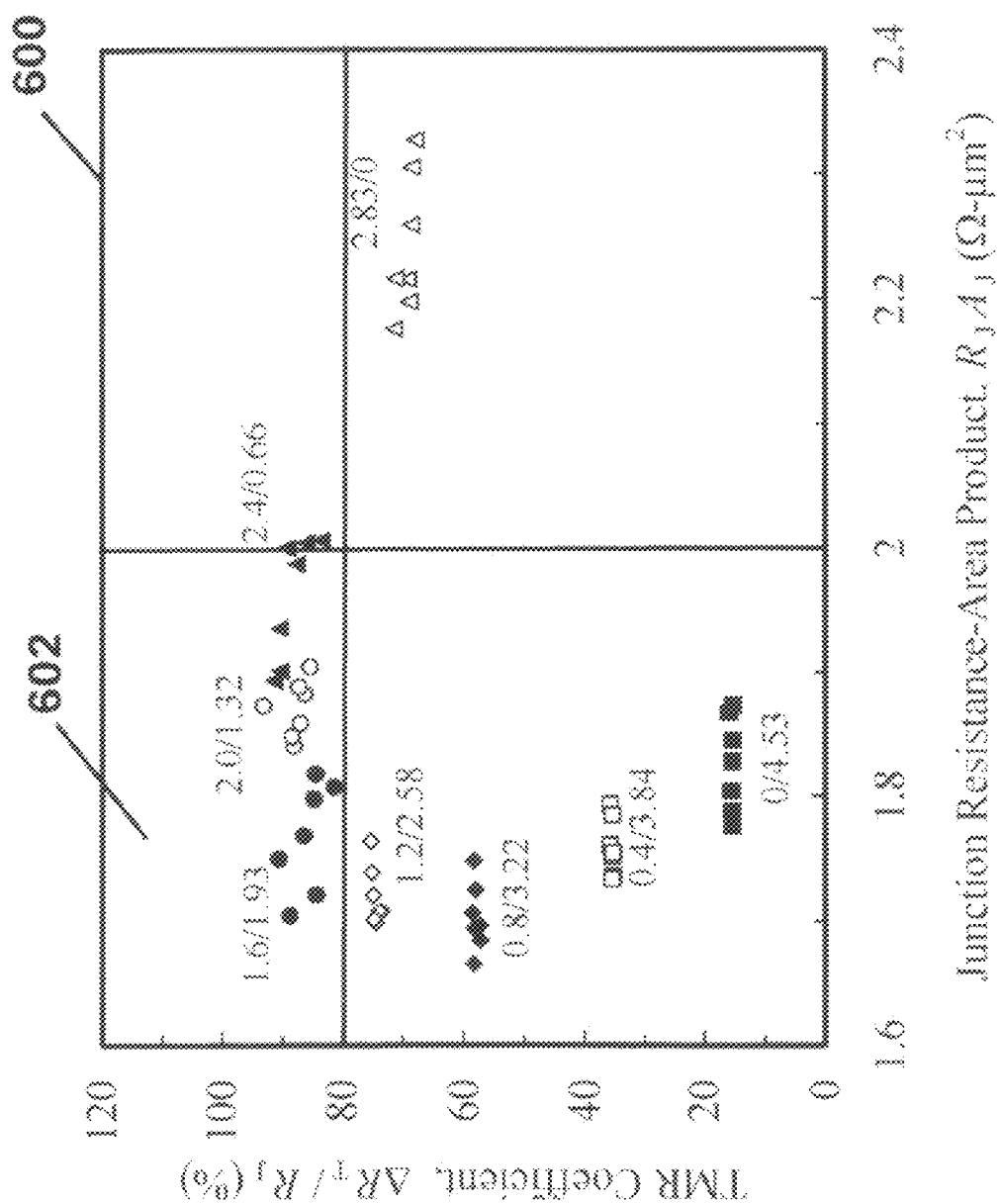
FIG. 6 is a graph of the TMR coefficient ($\Delta R_T/R_J$) versus the junction resistance-area product ($RA_JA_J$) for the TMR read sensor with the lower and upper sense layers comprising the 85.2Co-3.8Fe-11B and 84.7Co-15.3Hf films, respectively, in accordance with an embodiment of the invention.

FIG. 6 is a graph 600 of the TMR coefficient ($\Delta R_T/R_J$) versus the junction resistance-area product ($RA_J$) for the TMR read sensor with the lower and upper sense layers comprising the 85.2Co-3.8Fe-11B and 84.7Co-15.3Hf films, respectively, in accordance with an embodiment of the invention. There are eight sets of data represented by different symbols (such as open circles, solid circles, open squares, solid squares, etc.). Each set of data refers to a specific thickness ratio of the lower sense layer to the upper sense layer. The numbers adjacent to the data symbols represent this specific thickness ratio in a format of (lower sense layer thickness/upper sense layer thickness). The $\Delta R_T/R_J$ versus $RA_J$ curve follows a nearly linear relationship when the thickness of the upper sense layers increases from 0 to 1.93 nm, and another nearly linear relationship when the thickness of the upper sense layers increases from 1.93 to 4.53 nm. Based on this bilinear relationship, optimal thickness ratios can be found in a region 602 in the upper left hand portion of the plot 600, where $RA_J$ is less than 2 $\Omega$-μm$^2$ and $\Delta R_T/R_J$ is greater than 80%. Data represented by the solid circles (for lower and upper sense layer thicknesses of 1.6 and 1.93 nm, respectively), open circles (for lower and upper sense layer thicknesses of 2.0 and 1.32 nm, respectively), and solid triangles (for lower and upper sense layer thicknesses of 2.4 and 0.66 nm, respectively) all fit within the region 602. It is of interest to note that as the lower sense layer thickness decreases to below 1.2 nm, $\Delta R_T/R_J$ drops quickly to less than 40%, even though $R_J A_J$ remains below 2 $\Omega$-μm$^2$. As the lower sense layer thickness increases to above 2.4 nm, $R_J A_J$ increase to above 2 $\Omega$-μm$^2$, and $\Delta R_T/R_J$ drops to below 80%.

Figure 7:
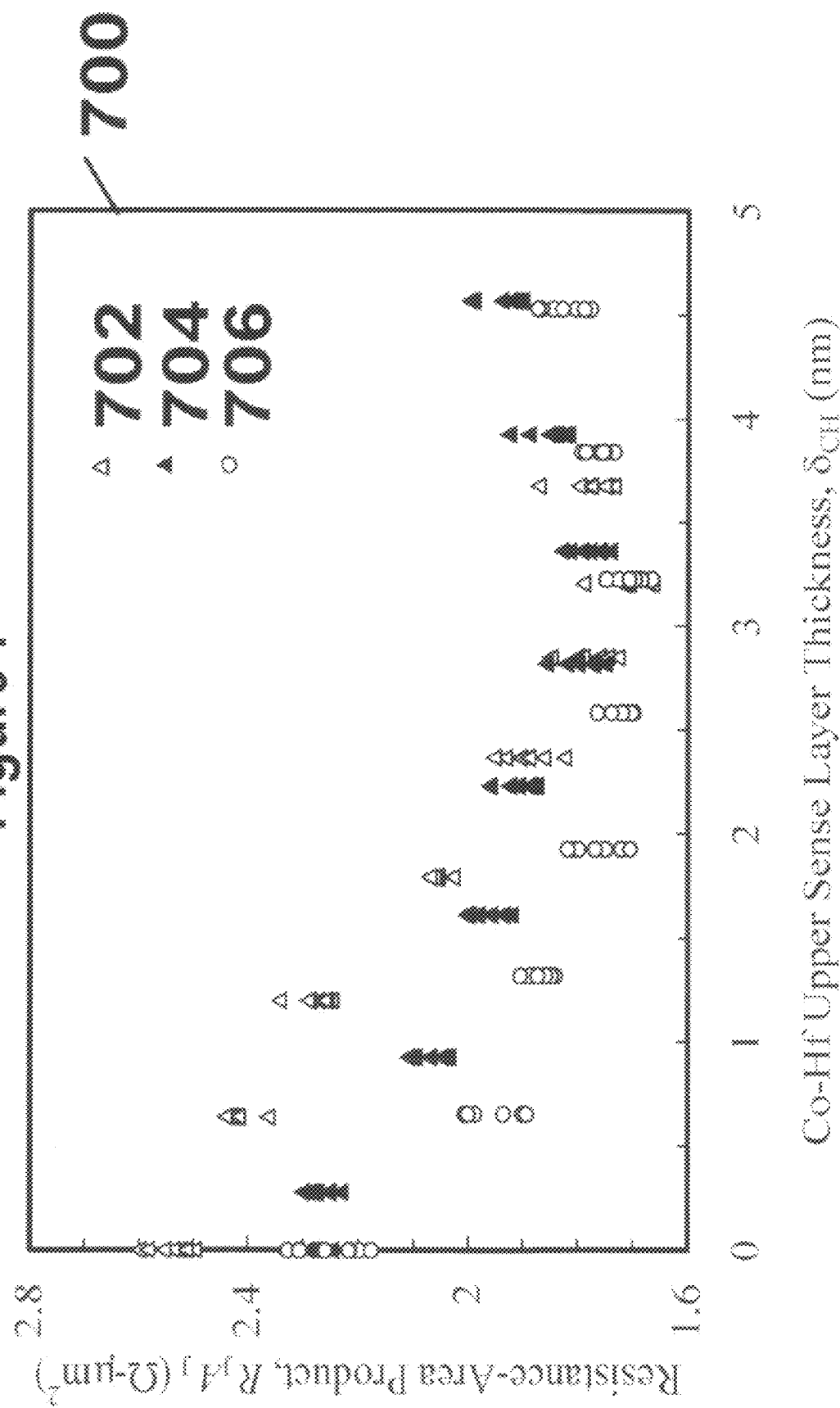
FIG. 7 is a graph of the junction resistance-area product ($R_JA_J$) versus the thickness of the upper sense layer in accordance with an embodiment of the invention.

FIG. 7 is a graph 700 of the junction resistance-area product ($R_J A_J$) versus the thickness of the upper sense layer in accordance with an embodiment of the invention. Plots 702, 704 and 706 show that while single sense layers comprising the 71.4Co-7.3Fe-21.3B, 79.1Co-5.5Fe-15.4B and 85.2Co-3.8Fe-11B films exhibit $RA_J$ of 2.54, 2.28 and 2.24 $\Omega$-μm$^2$, respectively, the single layer formed by the 84.7Co-15.3Hf film as low as 1.94 $\Omega$-μm$^2$. A lower B content thus leads to a lower $R_JA_J$. This result indicates that boron may diffuse into interfaces of the single sense layer with the $MgO_x$ barrier and Ru cap layers, causing increases in contact resistance and $R_JA_J$. Surprisingly, the plots 702, 704 and 706 also show that by varying the thicknesses of the lower and upper sense layers, the dual sense layers exhibit $RA_J$ that may be lower than a value predicted based on a linear relationship between the two extreme values. For example, when the lower and upper sense layers comprise 1.67 nm thick 85.2Co-3.8Fe-11B and 3.22 nm thick 84.7Co-15.3Hf films, respectively, $RA_J$ reaches as low as 1.70 $\Omega$-$\mu m^2$, instead of 2.03 $\Omega$-$\mu m^2$ as predicted from the linear relationship. To attain a desirable $RA_J$ of below 2 $\Omega$-$\mu m^2$, the plot 704 indicates that the thickness of the 84.7Co-15.3Hf film preferably ranges from 1.61 to 4.57 nm for the 79.1Co-5.5Fe-15.4B/84.7Co-15.3Hf dual sense layers, while the plot 706 indicates that the thickness of the 84.7Co-15.3Hf film preferably ranges from 0.66 to 4.57 nm for the 85.2Co-3.8Fe-11B/84.7Co-15.3Hf dual sense layers.

Figure 8:
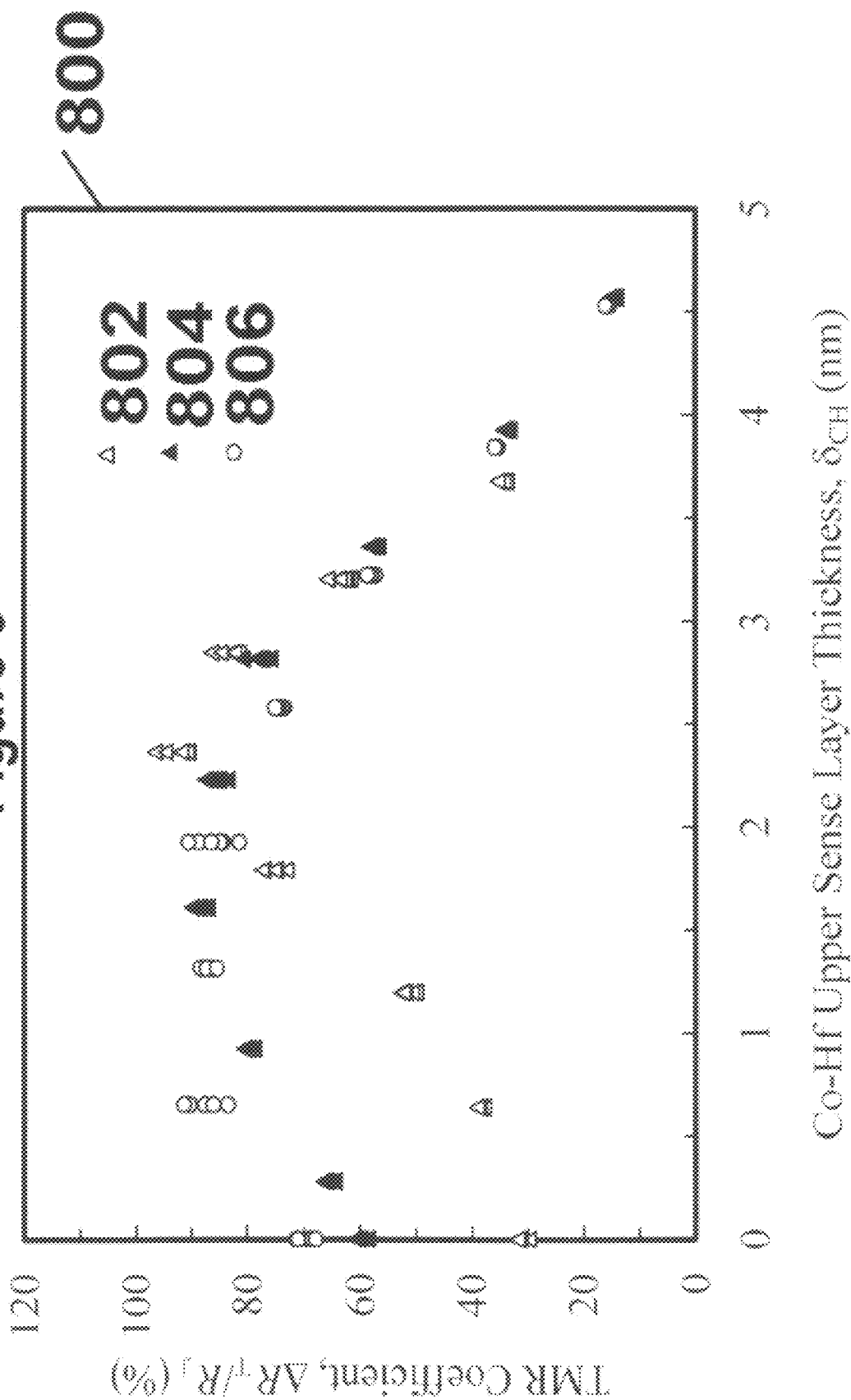
FIG. 8 is a graph of the TMR coefficient ($\Delta R_T/R_J$) versus the thickness of the upper sense layer in accordance with an embodiment of the invention.

FIG. 8 is a graph 800 of the TMR coefficient ($\Delta R_T/R_J$) versus the thickness of the upper sense layer in accordance with an embodiment of the invention. Plots 802, 804 and 806 show that while single sense layers comprising the 71.4Co-7.3Fe-21.3B, 79.1Co-5.5Fe-15.4B and 85.2Co-3.8Fe-11B films exhibit $\Delta R_T/R_J$ of 31.3, 59.5 and 69.4%, respectively, the single layer comprising the 84.7Co-15.3Hf film as low as 14.7%. A lower B content thus leads to a higher $\Delta R_T/R_J$. This result indicates that a lower B content may facilitate the transformation from "soft" amorphous to polycrystalline phases in the Co—Fe—B single sense layer after annealing at a low temperature, thus developing the epitaxial relationship and leading to a higher $\Delta R_T/R_J$. It should be noted though that the phase transformation in the single sense layer with a higher B content can also be fully completed to develop the needed epitaxial relationship and to attain a higher $\Delta R_T/R_J$, after annealing at higher temperatures (for example, 280° C.). However, a lower annealing temperature is preferred in the invention, since $\lambda_S$ substantially increases with increasing the annealing temperature. In addition, the plots 802, 804 and 806 also show that by varying the thicknesses of the lower and upper sense layers, the dual sense layers exhibit $\Delta R_T/R_J$ that is much higher than a value predicted based on a linear relationship between the two extreme values. For example, when the lower and upper sense layers comprise 2.0 nm thick 85.2Co-3.8Fe-11B and 1.32 nm thick 84.7Co-15.3Hf films, respectively, $\Delta R_T/R_J$ reaches as high as 88.3%, instead of 53.6% as predicted from the linear relationship. To attain a desirable high $\Delta R_T/R_J$ of more than 80%, the plot 804 indicates that the thickness of the 84.7Co-15.3Hf film preferably ranges from 0.93 to 2.82 nm for the 79.1Co-5.5Fe-15.4B/84.7Co-15.3Hf dual sense layers, while the plot 806 indicates that the thickness of the 84.7Co-15.3Hf film from 0.66 to 2.50 nm for the 85.2Co-3.8Fe-11B/84.7Co-15.3Hf dual sense layers.

It should be noted that during optimizing compositions and thicknesses of the lower and upper sense layers, the designed magnetic moment of 0.32 memu/cm² must be maintained. After determining the optimal thickness of the upper sense layer comprising a 84.7Co-15.3 Hf film as shown in FIGS. 5, 7 and 8, optimal thicknesses of the lower sense layers comprising the 79.1Co-5.5Fe-15.4B and 85.2Co-3.8Fe-11B films may be determined from plots 404 and 406, respectively. For example, for the lower sense layer comprising the 79.1Co-5.5Fe-15.4B film, when the optimal thickness of the upper sense layer is 2.2 nm, that of the lower sense layer is 1.6 nm. For the lower sense layer comprising the 85.2Co-3.8Fe-11B film, when the optimal thickness of the upper sense layer is 1.32 nm, that of the lower sense layer is 2 nm.

In summary, Table 1 lists ferromagnetic and electrical properties of TMR read sensors with various single and dual sense layers as described in FIGS. 4-8. The ferromagnetic properties are characterized by $\lambda_S$, $H_C$ and $H_F$, while the electrical properties by $R_JA_J$ and $\Delta R_T/R_J$. After optimizations of compositions and thicknesses of the dual sense layers as previously described, the TMR read sensors with various dual sense layers in general exhibit ferromagnetic and TMR properties better than those with various single sense layers.

TABLE 1

Ferromagnetic and electrical properties of TMR read sensors with various single and dual sense layers.

| Sense Layers (nm) | $\lambda_S$ ($\times 10^{-6}$) | $H_C$ (Oe) | $H_F$ (Oe) | $R_JA_J$ ($\Omega$-$\mu m^2$) | $\Delta R_T/R_J$ (%) |
|---|---|---|---|---|---|
| 71.4Co—7.3Fe—21.3B(4) | 0.9 | 1.8 | 42.8 | 2.54 | 31.3 |
| 79.1Co—5.5Fe—15.4B(3.1) | 0.2 | 3.1 | 58.5 | 2.28 | 59.5 |
| 85.2Co—3.8Fe—11B(2.8) | −2.7 | 8.7 | 61.6 | 2.24 | 69.4 |
| 84.7Co—15.3Hf(4.6) | 2.2 | 2.8 | 43.3 | 1.94 | 14.7 |
| 71.4Co—7.3Fe—21.3B(1.2)/ 84.7Co—15.3Hf(2.8) | 0.8 | 4.1 | 88.7 | 1.78 | 83.2 |
| 79.1Co—5.5Fe—15.4B(1.6)/ 84.7Co—15.3Hf(2.2) | −0.9 | 7.1 | 84.0 | 1.79 | 85.8 |
| 85.2Co—3.8Fe—11B(2)/ 84.7Co—15.3Hf(1.32) | −3.3 | 12.0 | 81.6 | 1.87 | 88.3 |

The study of the composition and thickness optimization in accordance with the embodiments of the invention indicate that, with respect to the lower sense layer, the Co content preferably ranges from 68 to 88 atomic %, the Fe content from 0 and 8 atomic %, and the B content from 8 to 24 atomic %. More preferably, the Co content is 82±4 atomic %, the Fe content 4±4 atomic %, and the B content 14±4 atomic %. With respect to the upper sense layer, the Co content preferably ranges from 70 to 90 atomic %, and the Hf content from 10 to 30 atomic %. More preferably, the Co content is 86±4 atomic %, and the Hf content 14±4 atomic %. In addition, the thickness of the lower sense layer ranges from 1 to 6 nm, and that of the upper sense layer from 0.4 to 6 nm.

Optimal thickness of the lower Co—Fe—B and upper sense layers depends on a sense-layer moment design. In a preferred embodiment, the thickness of the Co—Fe—B lower sense layer preferably ranges from 0.6 to 2.6 nm, and that of the Co—Hf upper sense layer from 2.4 to 1.2 nm. More preferably, the thickness of the Co—Fe—B lower sense layer is 2±0.4 nm, and that of the Co—Hf upper sense layer is 1.2±0.4 nm.

The invention is not limited by the previous embodiments heretofore described. Rather, the scope of the invention is to be defined by these descriptions taken together with the attached claims and their equivalents.

What is claimed is:

1. A thin film magnetic head having a TMR read sensor comprising:
   a magnesium oxide barrier layer;
   a lower sense layer, comprising a Co—Fe—B alloy, deposited on said magnesium oxide barrier layer;
   an upper sense layer, comprising a Co—Hf alloy, deposited on said lower sense layer; and
   a cap layer deposited on said upper sense layer, wherein said TMR read sensor has a saturation magnetostiction value less than zero, a resistance-area product less than 2.5 W-$\mu m^2$, and a TMR coefficient greater than 75%.

2. The magnetic head as recited in claim 1, wherein said upper sense layer comprises an alloy containing between 84 and 85 atomic % Co, and between 15 and 16 atomic % Hf.

3. The magnetic head as recited in claim 2, wherein said lower sense layer comprises an alloy containing between 71 and 86 atomic % Co, between 8 and 3 atomic % Fe, and between 11 and 22 atomic % B.

4. The magnetic head as recited in claim 3, wherein said lower sense layer comprises an alloy containing between 79 and 86 atomic % Co, between 5 and 3 atomic % Fe, and between 11 and 15 atomic % B.

5. The magnetic head as recited in claim 1, wherein said lower sense layer comprises an alloy containing between 71 and 86 atomic % Co, between 8 and 3 atomic % Fe, and between 11 and 22 atomic % B.

6. The magnetic head as recited in claim 5, wherein said lower sense layer comprises an alloy containing between 79 and 86 atomic % Co, between 5 and 3 atomic % Fe, and between 11 and 15 atomic % B.

7. The magnetic head as recited in claim 1, wherein said upper sense layer is between 0.5 and 5 nm in thickness.

8. The magnetic head as recited in claim 7, wherein said upper sense layer is between 0.5 and 2.5 nm in thickness.

9. The magnetic head as recited in claim 2, wherein said upper sense layer is between 0.5 and 2.5 nm in thickness.

10. The magnetic head as recited in claim 1, wherein said lower sense layer is between 0.5 and 4 nm in thickness.

11. The magnetic head as recited in claim 10, wherein said lower sense layer is between 1.3 and 2.5 nm in thickness.

12. The magnetic head as recited in claim 4, wherein said lower sense layer is between 1.3 and 2.5 nm in thickness.

13. A thin film magnetic head having a TMR read sensor comprising:
a magnesium oxide barrier layer;
a lower sense layer, comprising a Co—Fe—B alloy, deposited on said magnesium oxide barrier layer, said Co—Fe—B alloy having a Co composition between 71 and 86 atomic %, an Fe composition between 8 and 3 atomic %, and a B composition between 11 and 22 atomic %;
an upper sense layer, comprising a Co—Hf alloy, deposited on said lower sense layer, said Co—Hf alloy having a Co composition between 84 and 85 atomic %; and
a cap layer deposited on said upper sense layer,
wherein said TMR read sensor has a saturation magnetostiction value less than zero, a resistance-area product less than 2 W-μm$^2$, and a TMR coefficient greater than 80%.

14. The magnetic head as recited in claim 13, wherein said lower sense layer comprises an alloy containing between 79 and 86 atomic % Co, between 5 and 3 atomic % Fe, and between 11 and 15 atomic % B.

15. The magnetic head as recited in claim 13, wherein said upper sense layer is between 0.5 and 5 nm in thickness.

16. The magnetic head as recited in claim 15, wherein said upper sense layer is between 0.5 and 2.5 nm in thickness.

17. The magnetic head as recited in claim 13, wherein said lower sense layer is between 0.5 and 4 nm in thickness.

18. The magnetic head as recited in claim 17, wherein said lower sense layer is between 1.3 and 2.5 nm in thickness.

19. A thin film magnetic head having a TMR read sensor comprising:
a magnesium oxide barrier layer;
a lower sense layer, comprising a Co—Fe—B alloy, deposited on said magnesium oxide barrier layer, said Co—Fe—B alloy having a Co composition between 79 and 86 atomic %, an Fe composition between 5 and 3 atomic %, and a B composition between 11 and 15 atomic %;
an upper sense layer, comprising a Co—Hf alloy, deposited on said lower sense layer, said Co—Hf alloy having a Co composition between 84 and 85 atomic %; and
a cap layer deposited on said upper sense layer,
wherein said TMR read sensor has a saturation magnetostiction value less than zero, a resistance-area product less than 2 W-μm$^2$, and a TMR coefficient greater than 80%.

20. The magnetic head as recited in claim 19, wherein said upper sense layer is between 0.5 and 2.5 nm in thickness.

21. The magnetic head as recited in claim 19, wherein said lower sense layer is between 1.3 and 2.5 nm in thickness.

* * * * *